United States Patent
Hsu et al.

(10) Patent No.: US 7,973,380 B2
(45) Date of Patent: Jul. 5, 2011

(54) METHOD FOR PROVIDING METAL EXTENSION IN BACKSIDE ILLUMINATED SENSOR FOR WAFER LEVEL TESTING

(75) Inventors: Tzu-Hsuan Hsu, Kaohsiung (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 434 days.

(21) Appl. No.: 11/532,674

(22) Filed: Sep. 18, 2006

(65) Prior Publication Data

US 2007/0117253 A1 May 24, 2007

Related U.S. Application Data

(60) Provisional application No. 60/739,685, filed on Nov. 23, 2005.

(51) Int. Cl.
*H01L 31/00* (2006.01)
(52) U.S. Cl. .............. 257/460; 257/E27.131; 250/214.1
(58) Field of Classification Search .................. 257/448, 257/433, 459, 460, E27.131; 250/214.1, 250/214 R
See application file for complete search history.

(56) References Cited

U.S. PATENT DOCUMENTS

| | | |
|---|---|---|
| 4,154,632 A | 5/1979 | Mochizuki et al. |
| 4,193,826 A | 3/1980 | Mochizuki et al. |
| 4,199,386 A | 4/1980 | Rosnowski et al. |
| 4,290,830 A | 9/1981 | Mochizuki et al. |
| 4,507,674 A | 3/1985 | Gaalema |
| 4,760,031 A | 7/1988 | Janesick |
| 5,005,063 A | 4/1991 | Janesick |
| 5,187,378 A * | 2/1993 | Takiguchi ............ 257/188 |
| 5,244,817 A | 9/1993 | Hawkins et al. |
| 5,511,428 A | 4/1996 | Goldberg |
| 6,114,739 A * | 9/2000 | Theil et al. ............ 257/458 |

(Continued)

FOREIGN PATENT DOCUMENTS

JP    09-246420    9/1997

(Continued)

OTHER PUBLICATIONS

Williams, George M., "Back-Illuminated CCD Imagers for High Information Content Digital Photography", SPIE, vol. 3302, Apr. 1998, pp. 39-53.

(Continued)

*Primary Examiner* — Jenny L. Wagner
(74) *Attorney, Agent, or Firm* — Haynes and Boone, LLP

(57) ABSTRACT

A method of providing metal extension in a backside illuminated image sensor is provided in the present disclosure. In one embodiment, a first set of pads and a second set of pads, and a metal layer are provided in a backside illuminated image sensor. The first set of pads are electrically coupled to the second set of pads through the metal layer, and a pad in the second set of pads is exposed to the surface of the backside illuminated image sensor for testing. In an alternative embodiment, a first set of pads, at least one second pad directly positioned over the first set of pads are provided in a backside illuminated image sensor. The first set of pads are electrically coupled to the at least one second pad and the at least one second pad is exposed to the surface of the backside illuminated image sensor for testing.

20 Claims, 8 Drawing Sheets

U.S. PATENT DOCUMENTS

| | | | |
|---|---|---|---|
| 6,168,965 B1 | 1/2001 | Malinovich et al. | |
| 6,169,319 B1 | 1/2001 | Malinovich et al. | |
| 6,227,055 B1 | 5/2001 | Pitzer | |
| 6,259,085 B1 | 7/2001 | Holland | |
| 6,429,036 B1 | 8/2002 | Nixon et al. | |
| 6,504,196 B1 | 1/2003 | Rhodes | |
| 6,635,912 B2 | 10/2003 | Ohkubo | |
| 6,703,598 B2 * | 3/2004 | Muramatsu et al. | 250/214.1 |
| 6,765,276 B2 | 7/2004 | Fasen et al. | |
| 6,821,809 B2 | 11/2004 | Abe et al. | |
| 6,884,651 B2 | 4/2005 | Toyoda et al. | |
| 6,946,352 B2 | 9/2005 | Yaung | |
| 2001/0017344 A1 | 8/2001 | Aebi | |
| 2004/0169625 A1 | 9/2004 | Park et al. | |
| 2004/0178350 A1 | 9/2004 | Nagano et al. | |
| 2005/0090035 A1 | 4/2005 | Kim | |
| 2005/0270055 A1 * | 12/2005 | Akram et al. | 324/765 |
| 2006/0057759 A1 | 3/2006 | Zhang et al. | |
| 2006/0057765 A1 * | 3/2006 | Hsu et al. | 438/70 |
| 2006/0121640 A1 | 6/2006 | Kim | |
| 2006/0197171 A1 | 9/2006 | Zhang et al. | |
| 2006/0197545 A1 * | 9/2006 | Caldwell et al. | 324/757 |
| 2006/0267123 A1 | 11/2006 | Wu | |
| 2007/0001100 A1 | 1/2007 | Hsu et al. | |
| 2007/0207566 A1 | 9/2007 | Fu et al. | |

FOREIGN PATENT DOCUMENTS

| | | |
|---|---|---|
| JP | 2002151676 | 5/2002 |
| JP | 2003203913 | 7/2003 |
| JP | 2005159195 | 6/2005 |

OTHER PUBLICATIONS

Japanese Patent Office, Office Action mailed Nov. 30, 2009, Application No. 2006-294834, 3 pages; and English translation, 3 pages.
Japan Patent Office, Office Action dated Nov. 22, 2010, Application No. 2006-294834, 2 pages.

* cited by examiner

METHOD FOR PROVIDING METAL EXTENSION IN BACKSIDE ILLUMINATED SENSOR FOR WAFER LEVEL TESTING

CROSS-REFERENCE

This patent claims the benefit of U.S. Ser. No. 60/739,685 filed Nov. 23, 2005, the contents of which are hereby incorporated by reference.

BACKGROUND

An image sensor provides a grid of pixels, such as photosensitive diodes or photodiodes, reset transistors, source follower transistors, pinned layer photodiodes, and/or transfer transistors, for recording an intensity or brightness of light. The pixel responds to the light by accumulating a charge—the more light, the higher the charge. The charge can then be used by another circuit so that a color and brightness can be used for a suitable application, such as a digital camera. Common types of pixel grids include a charge-coupled device (CCD) or complimentary metal oxide semiconductor (CMOS) image sensor.

Backside illuminated sensors are used for sensing a volume of exposed light projected towards the backside surface of a substrate. The pixels are located on a front side of the substrate, and the substrate is thin enough so that light projected towards the backside of the substrate can reach the pixels. Backside illuminated sensors provide a high fill factor and reduced destructive interference, as compared to frontside illuminated sensors.

A problem with backside illuminated sensors is that the substrate is relatively thin to allow for sufficient radiation transmission. To accommodate the thinned substrate, it is typical to attach a supplemental device, such as a carrier wafer, to the front side of the wafer (over the metal lines and other backend layers) on which one or more sensors are being fabricated. Typically, the carrier wafer is a semiconductor material, such as silicon, or an optical transparent material, such as glass, which has a thickness of greater than 200 μm. However, the carrier wafer blocks or prevents ready access to the bond pads of individual sensors on the wafer. As a result, certain types of wafer acceptance testing cannot be performed, such as probe testing and design performance testing. Probe testing measures performance of device or process parameter, such as transistor performance, line spacing, and line, to ensure that the values are within specification. Design performance testing checks the functionality of the chip to ensure that it is within design performance specification.

A need exists for a method and system that allows wafer level testing to be performed on backside illuminated sensors without passing through the thick carrier wafer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
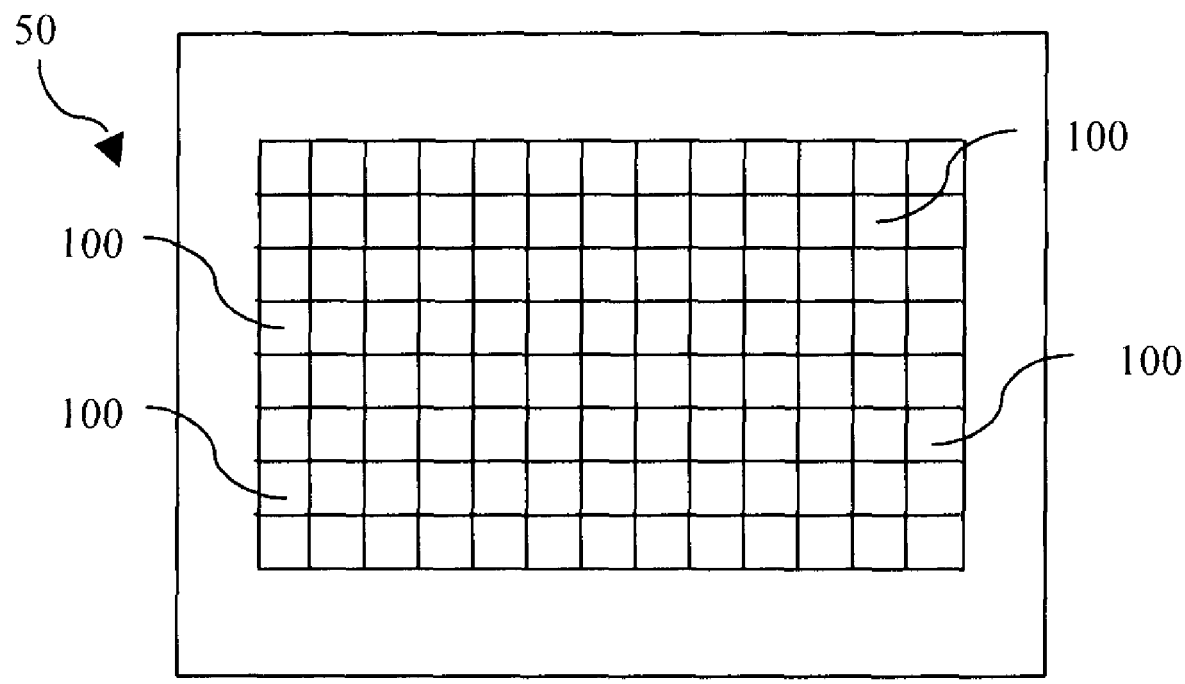
FIG. 1 is a view of a sensor having a plurality of pixels.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, an image sensor 50 comprises a plurality of pixels 100. In one embodiment, individual pixel 100 includes photodiode, reset transistor, source follower transistor, and select transistor. This type of image sensor is known as 3T CMOS Image Sensor (3T CIS). Within an image sensor such as a 3T CMOS Image Sensor, each pixel 100 may include a photodiode and up to three transistors. In an alternative embodiment, individual pixel 100 includes pinned layer photodiode, reset transistor, source follower transistor, select transistor, and transfer transistor. This type of image sensor is known as 4T CMOS Image Sensor (4T CIS). Within an image sensor such as 4T CMOS Image Sensor, each pixel 100 may include a pinned photodiode and up to four transistors. In addition to the above types, image sensor 50 can be of various different types, including a charge-coupled device (CCD), a complimentary metal oxide semiconductor (CMOS) image sensor (CIS), an active-pixel sensor (ACP), or a passive-pixel sensor. Additional circuitry and input/outputs are typically provided adjacent to the grid of pixels 100 for providing an operation environment for the pixels and for supporting external communications with the pixels.

Figure 2:
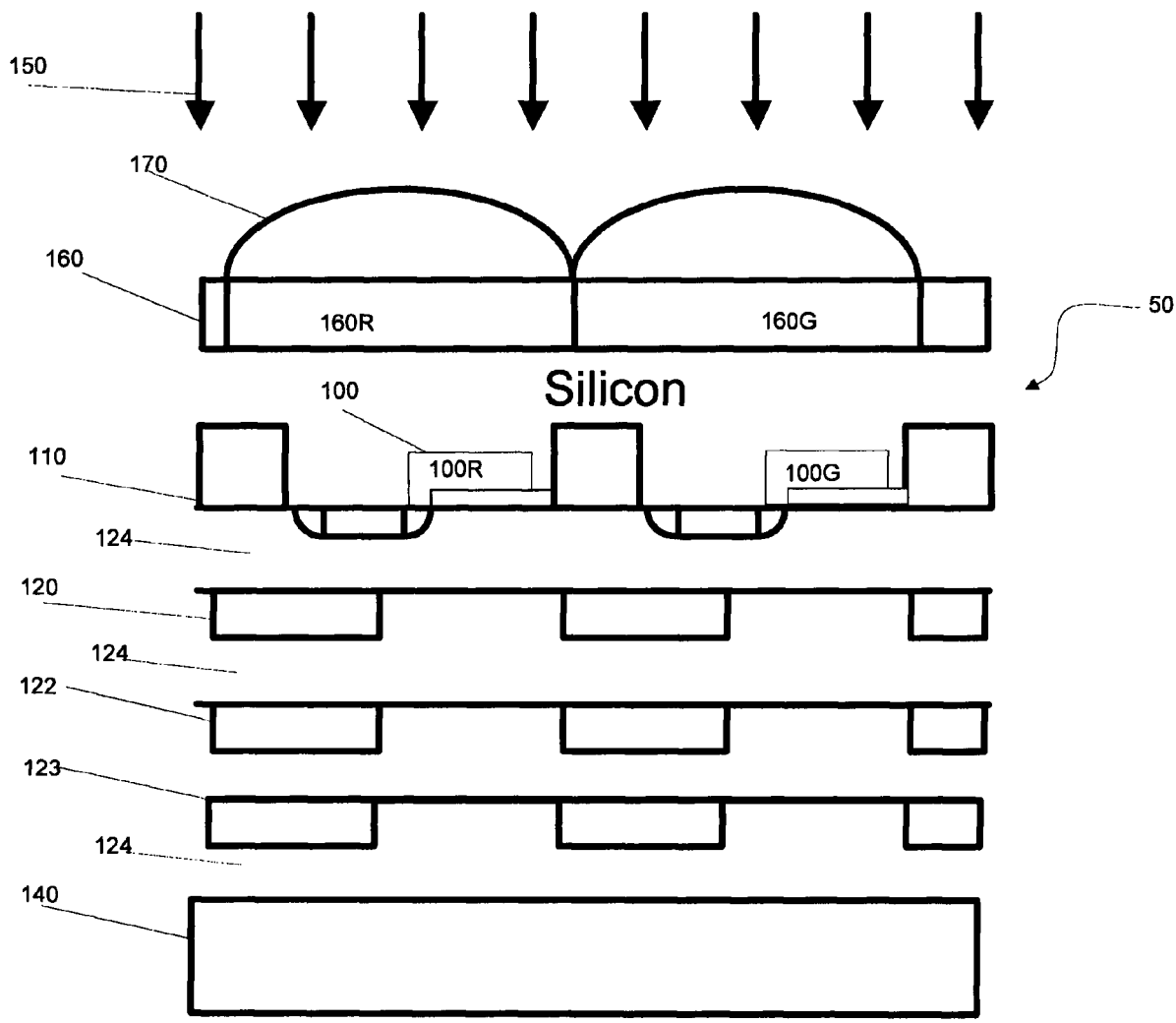
FIG. 2 is a side, cross-sectional view of a backside illuminated sensor with a carrier wafer attached.

Referring now to FIG. 2, in an illustrative embodiment, image sensor 50 includes a substrate 110 that comprises an elementary semiconductor such as silicon, germanium, and diamond. Alternatively, sensor 50 may include a silicon-on-insulator (SOI) comprising silicon and silicon oxide, or an epitaxial layer, or other combination of layers. In other embodiments, the substrate 110 may also comprise a compound semiconductor such as silicon carbide, gallium arsenic, indium arsenide, and indium phosphide. The substrate 110 may comprise an alloy semiconductor such as silicon germanium, silicon germanium carbide, gallium arsenic phosphide, and gallium indium phosphide.

In the present embodiment, the substrate 110 comprises P-type silicon formed over a silicon oxide base. Silicon doping may be implemented using a process such as ion implantation or diffusion in various steps. The substrate 110 may comprise lateral isolation features to separate different devices formed on the substrate. The thickness of the substrate 110 has been thinned to allow for etching of the backside of the substrate. This reduction in thickness may be accomplished by back grinding, diamond scrubbing, chemical mechanical planarization (CMP), wet or dry etching or other similar techniques.

The sensor 50 includes a plurality of pixels 100 formed on the front surface of the semiconductor substrate 110. For the sake of example, the pixels are further labeled 100R and 100G to correspond with example light wavelengths of red and green, respectively. Alternatively, the plurality of pixels 100 may include other light wavelengths, such as light wavelength of blue. The sensor 50 further includes additional layers, including first, second, and third metal layers 120, 122, 123 and one or more Inter-Metal Dielectric(IMD) layers 124 between the metal layers or other layers. The metal layers 120, 122 and 123 may be aluminum-based material or copper-based material made by damascene technology. Typically, the number of metal layers is 3-level metal interconnections. In System-On-Chip(SoC) applications such as logic embedded circuit, the number of metal layers can be 4-level metal interconnections or more than 6-level metal interconnections. One or more of the dielectric layers may comprise a low-k material formed by PECVD, as compared to a dielectric constant of silicon dioxide. Alternatively, the dielectric layers 124 may comprise carbon-doped silicon oxide, fluorine-doped silicon oxide, silicon oxide, silicon nitride, and/or organic low-k material. In SoC application, dielectric constant of the dielectric layers 124 is less than about 3.2.

Additional circuitry also exists to provide an appropriate functionality to handle the type of pixels 100 being used and the type of light being sensed. In some embodiments, the sensor 50 may be a part of a system-on-chip (SOC). It is understood that the wavelengths red, green, and blue are provided for the sake of example, and that the pixels 100 are generally illustrated as being photodiodes for the sake of example. In addition, metal layers 120 and 122 are shown in FIG. 2 is for illustrative purpose. Additional metal layers may be included in image sensor 50 without departing the spirit and scope of the present disclosure.

The sensor 50 is designed to receive light 150 directed towards the back surface of the semiconductor substrate 110, eliminating any obstructions to the optical paths by other objects such as gate features and metal lines, and maximizing the exposure of the light-sensing region to the illuminated light. The illuminated light 150 is not limited to visual light beam, but can be infrared (IR), ultraviolet (UV), and other radiation.

The sensor 50 further comprises a color filter layer 160. The color filter layer 160 can support several different color filters (e.g., red, green, and blue), and may be positioned such that the incident light is directed thereon and there through. In one embodiment, such light-transparent layers may comprise a polymeric material (e.g., negative photoresist based on an acrylic polymer) or resin. The color filter layer 160 may comprise negative photoresist based on an acrylic polymer including color pigments. In continuance of the present example, color filters 160R and 160G correspond to pixel 100R and pixel 100G, respectively.

The sensor 50 may comprise a plurality of lenses 170, such as microlenses, in various positional arrangements with the pixels 100 and the color filters 160, such that the backside-illuminated light 150 can be focused on the light-sensing regions.

At some point during or at the end of wafer fabrication, a supporting structure is applied to the sensor 50 and other sensors on the corresponding wafer. In the present embodiments, the upper-most layer of image sensor 50 is bonded with carrier wafer 140. It is understood that this may be a dielectric layer, a passivation layer, polyimide, or other appropriate layer. Carrier wafer 140 has a thickness greater than about 200 μm, which provides extra support to the structure of image sensor 50 due to the thinning of substrate 110. However, thick carrier wafer 140 prevents wafer level testing, such as probe and design performance testing, from being performed, because probes are unlikely to penetrate through the thick carrier wafer 140 to contact pads such as bond pads or test pads, as described in detail below.

Figure 3:
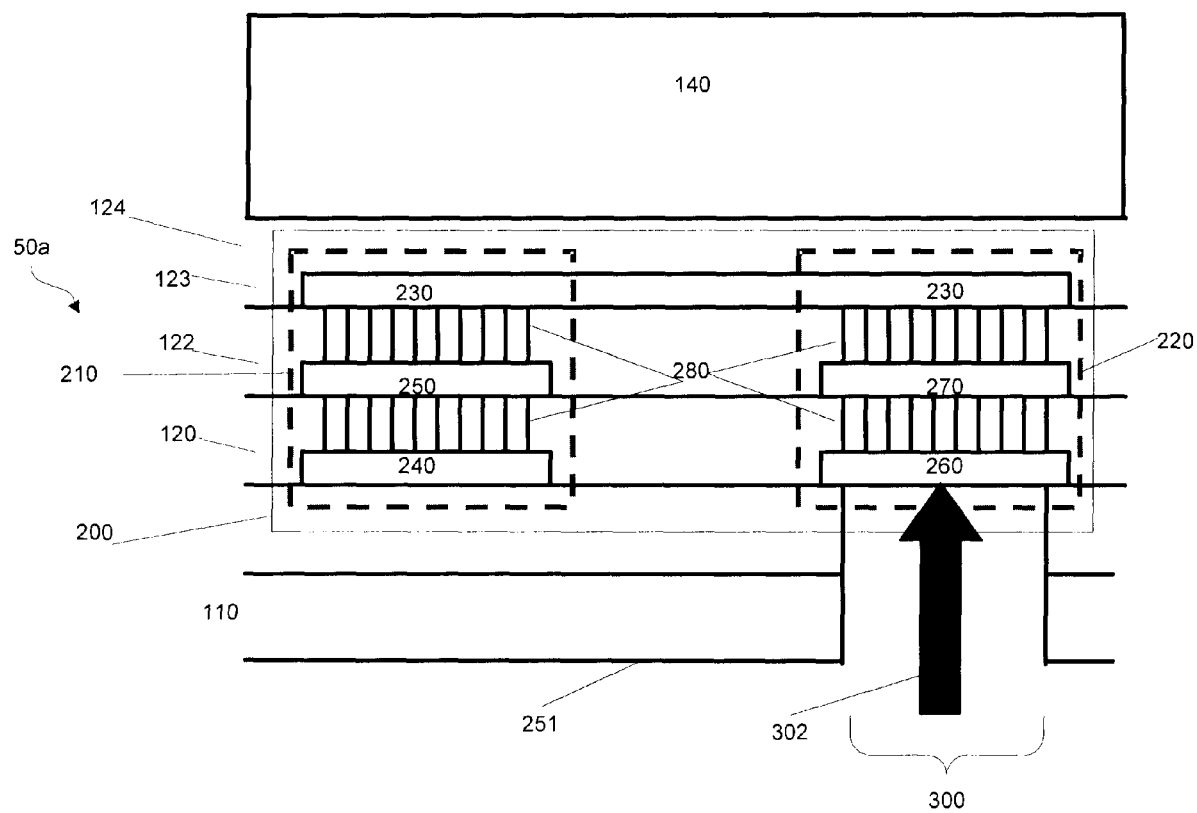
FIGS. 3, 4A and 4B are side, cross-sectional views of a backside illuminated sensor according to various embodiments of the present invention.

Referring now to FIG. 3, the sensor chip is designated with the reference numeral 50a and includes a first bond pad set 210 that can be modified according to one or more embodiments of the present invention. The first bond pad set 210 includes metal pads 240, 250, 230 in metal layers 120, 122, 123, respectively, with a plurality of contacts or vias 280 (generically referred to as vias) in between. It is understood that the present three-layer configuration is provided merely for example. An extended bond pad 200 is created by extending one or more of the metal pads 230, 240, 250, (230 was extended in the example of FIG. 3) out beyond the end 251 of the sensor chip 50a into a scribe line area of the wafer on which the sensor chip resides.

The extended bond pad 200 further includes a second bond pad set 220, illustrated by the dotted line located (in whole or in part) outside the end 251 of the sensor chip 50a. As shown in the figure, the second bond pad set 220 also spans the three metal layers 120, 122, 123 with metal pads 260, 270 and 230, respectively. In the present embodiment, the second bond pad set 220 lies wholly in the scribe line area between two adjacent sensor chips 50a on a common wafer substrate.

Since the second bond pad set 220 is located in the scribe line area, it can be readily accessed through the substrate 110 without otherwise damaging or affecting the sensor chip 50a. Alternatively, if the second bond pad set 220 is used for assembly, it may be accessed in the periphery of 50a and not in the scribe area. An opening 300 can be formed in the substrate 110 using conventional processes. For example, a patterned photoresist layer can be applied to the backside of the substrate 110 and the opening 300 can be etched therethrough. Alternatively, other chemical and/or mechanical processes can be used to create the opening 300. The opening 300 is relatively easy to create, as compared to an opening in the carrier wafer 140, due to the comparatively thin property of the substrate 110. The opening 300 is positioned directly over the second bond pad set 220 so that metal pad 260 on the first metal layer 120 can be probed or otherwise accessed, as illustrated by testing probe 302. By providing access to pad 260, testing measurements may be performed using extended bond pad 200 while the sensor chip 50a is still on the wafer (i.e., before assembly).

Figure 4A:
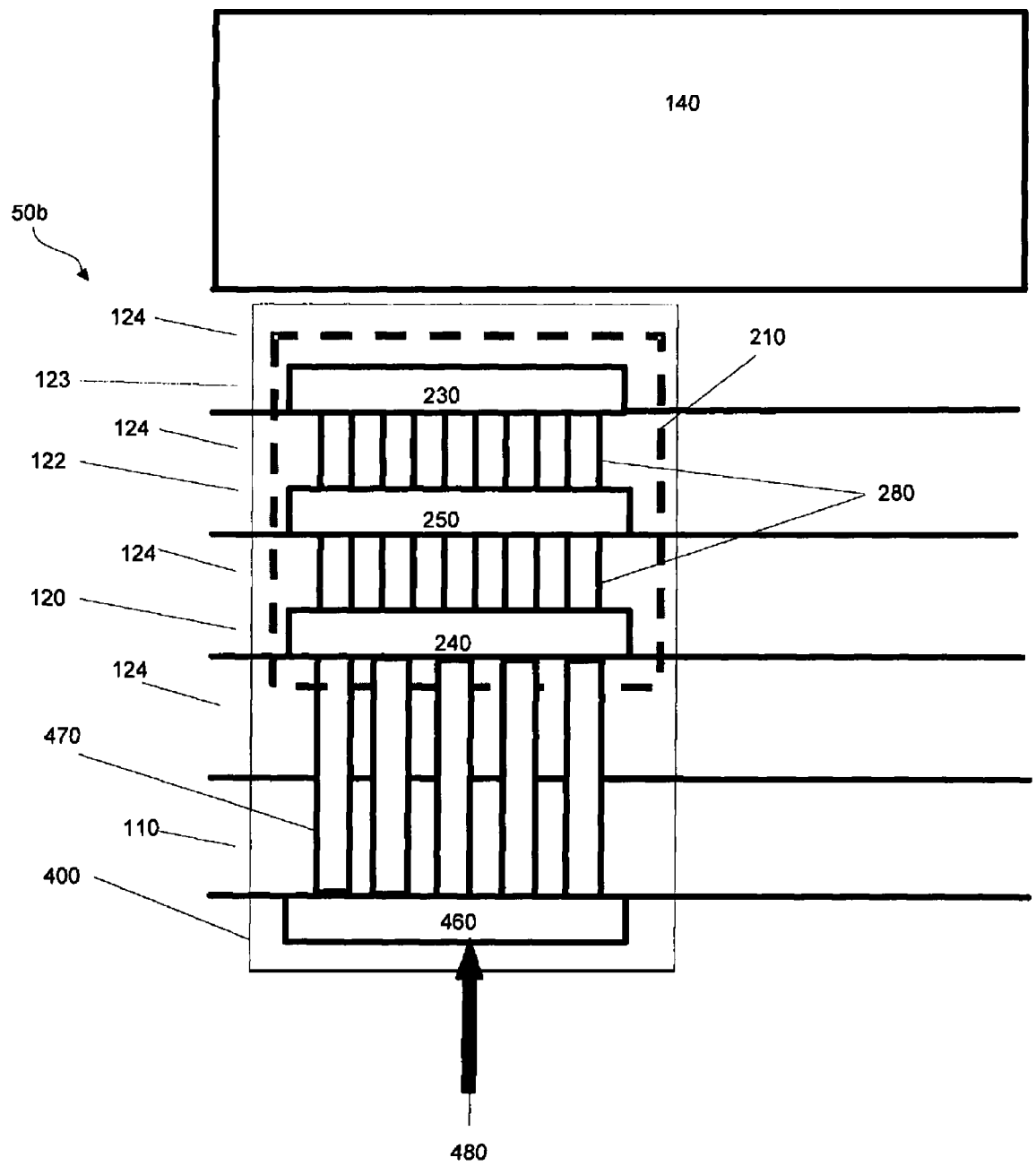

Referring now to FIG. 4A, in another embodiment, the sensor chip is designated with the reference numeral 50b and includes a metal extension 400. The metal extension 400 comprises the first bond pad set 210, similar to that disclosed in FIG. 3. The first bond pad set 210 includes metal pads 240, 250, 230 in metal layers 120, 122, 123, respectively, with a plurality of vias 280 in between.

Unlike metal extension 200 in FIG. 3, metal extension 400 comprises another metal pad 460 at or near the back side of the substrate 110, with a plurality of vias 470 between pads 240 and 460. Metal pad 460 may be power pad or ground pad. To provide sufficient mechanical strength, the thickness or area of the metal pad 460 is greater than the first bond pad set 210, preferably greater than 1.5 times of the first bond pad set 210. In the present embodiment, vias 470 extend through any existing layers between the two pads 240, 460, including the interlevel dielectric layer 124 and substrate 110 and electrically couple the second pad 460 and the first set of pads 210. In addition, pad 460 is positioned directly over pad 240 such that pad 240 on the first metal layer 120 can be accessed by a probe or wire 480. By providing a probe or wire access to pad 460, testing measurements may be taken from pad 460 without penetrating through carrier wafer 140. Thus, wafer level testing may now be performed. It is noted this example includes a single pad 460 above the substrate 110 for illustrative purpose. Other embodiments may include one or more pads in, above, or below the substrate 110 without departing the spirit and scope of the present disclosure.

Figure 4B:
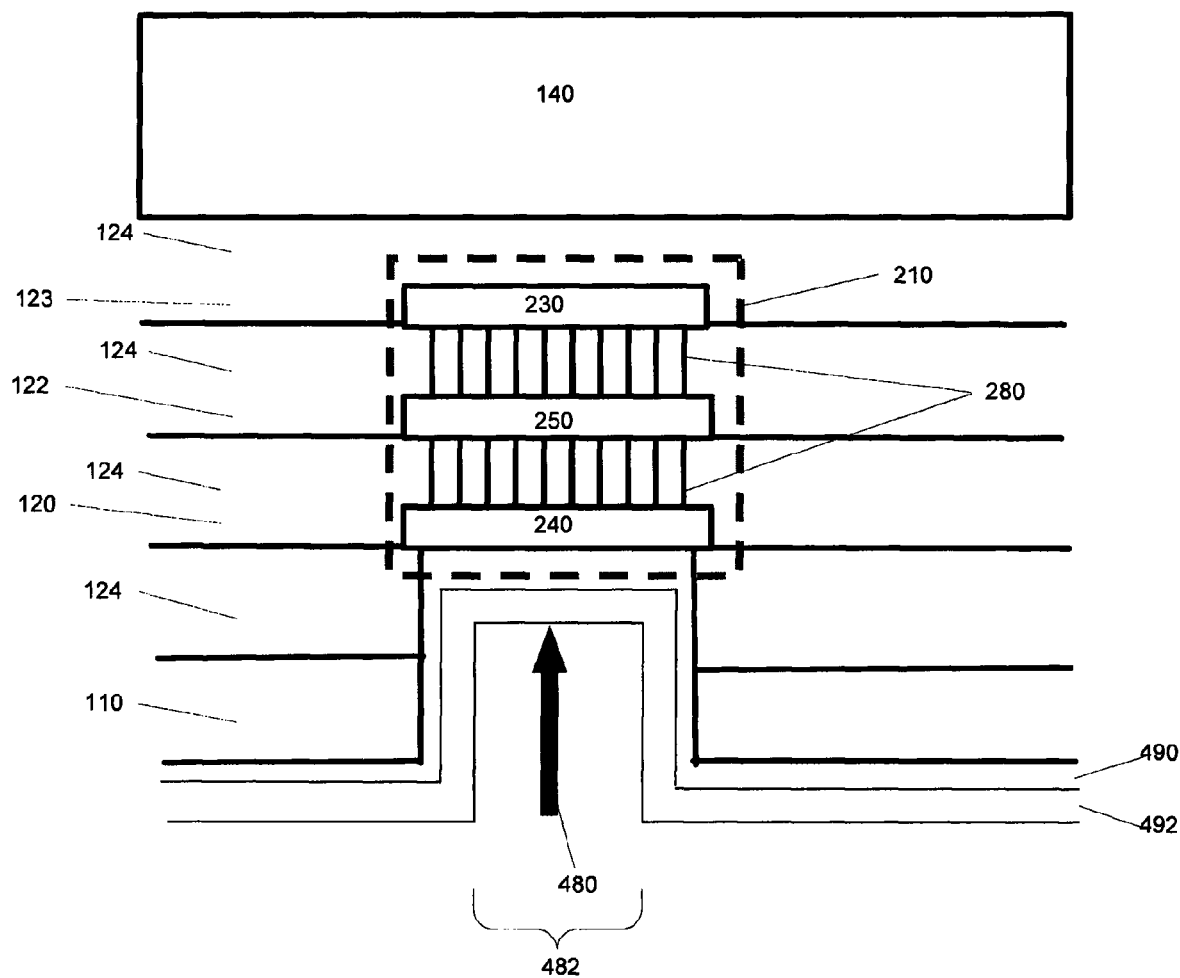

Referring now to FIG. 4B, in yet another embodiment, the sensor chip is designated with the reference numeral 50c and includes a metal extension 400. The metal extension 400 comprises the first bond pad set 210, similar to that disclosed in FIG. 3. The first bond pad set 210 includes metal pads 240, 250, 230 in metal layers 120, 122, 123, respectively, with a plurality of vias 280 in between. A direct access by wire or probe 480 is provided through the substrate 110 via an opening 482 from the backside of metal pad 240. In this illustrative embodiment, the opening 482 may be formed by etching of silicon substrate and Inter-Layer Dielectric (ILD). The ILD may compose of doped silicon oxide or a low-k dielectric material. The width of the opening 482 is preferably from about 30 μm to 200 μm. Also in this illustrative embodiment, a metal barrier layer 490 is lining surface of the opening 482 and on the backside of metal pad 240. A conductive layer 492 then overlies the metal barrier layer 490.

Figure 5:
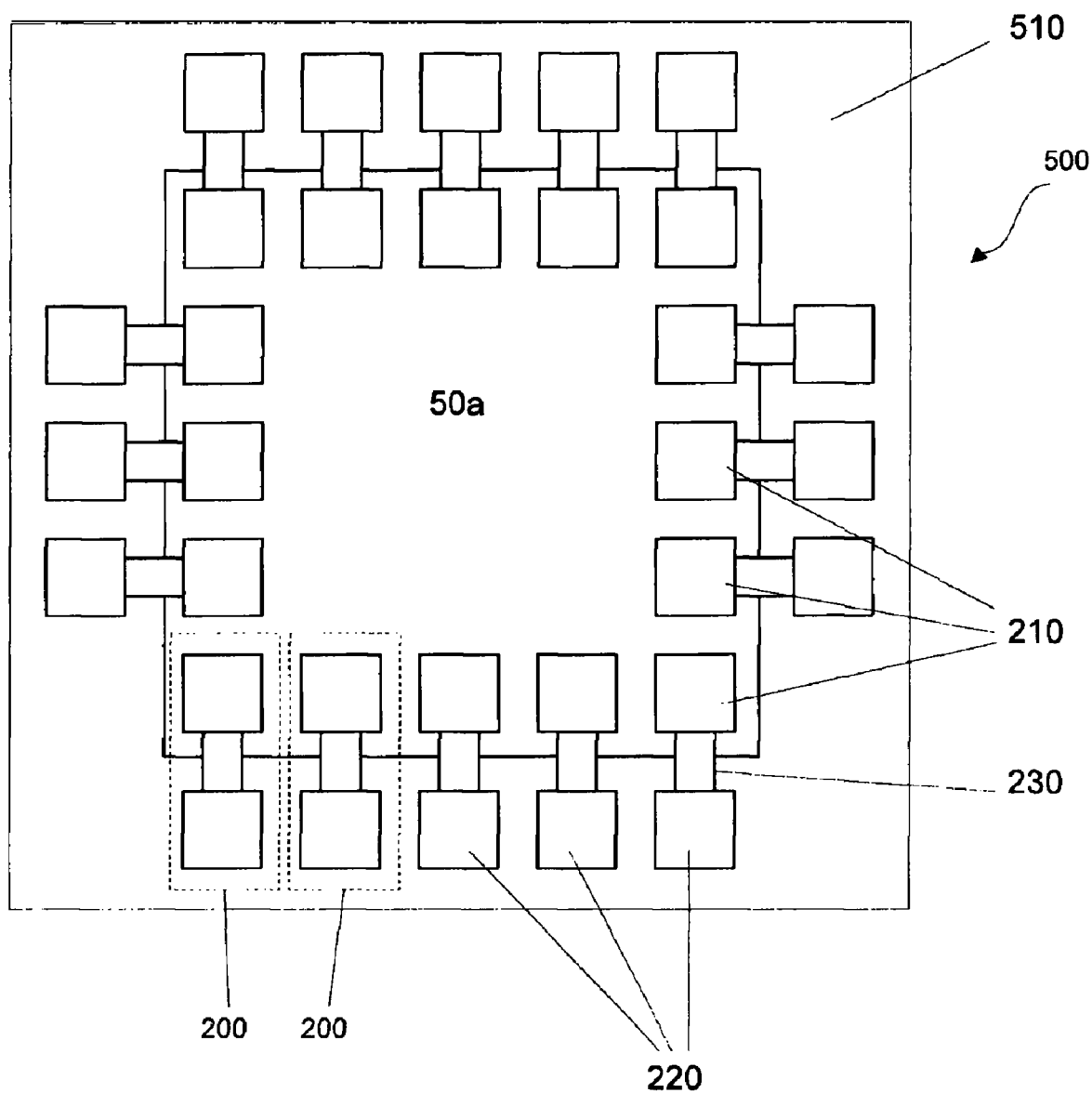
FIGS. 5 and 6 are top views of a backside illuminated sensor corresponding to FIGS. 3 and 4, respectively.

FIG. 5 illustrates the backside illuminated image sensor chip 50a on a wafer 500, according to the embodiments of FIG. 3 above. As shown in FIG. 5, sensor chip 50a comprises a plurality of extended bond pads 200, each including a first bond pad set 210 and a second bond pad set 220. In the present embodiment, the first set of pads 210 are located in the peripheral area of sensor chip 50. As described above, the first bond pad set 210 is electrically coupled to a second set of pads 220 via a metal extension 230. The second set of pads 220 is located in a scribe area 510. The scribe area 510 is an area outside of the chip 50a, and can be used for sawing the wafer 500 into individual die (chips 50). In this illustrative embodiment, the scribe area 510 is enlarged such that the second set of pads 220 may be probed or wire bonded before the dies are separated. By providing the second set of pads 220 in scribe line area 510, probes and wires may easily reach the pad coupled to the backside metal layer 240 in order to take measurements for testing purposes.

In other embodiments, only a subset of the bond pads on the sensor chip 50a include extended bond pads 200. Further, it is not required that the first bond pad set 200 be located at the periphery of the sensor chip 50 and/or the second bond pad set be located in the scribe line area. For example, the second bond pad set may be located in another portion of the chip 50, thereby maintaining the second bond pad set in a desired position for assembly wafer test and probe.

Figure 6:
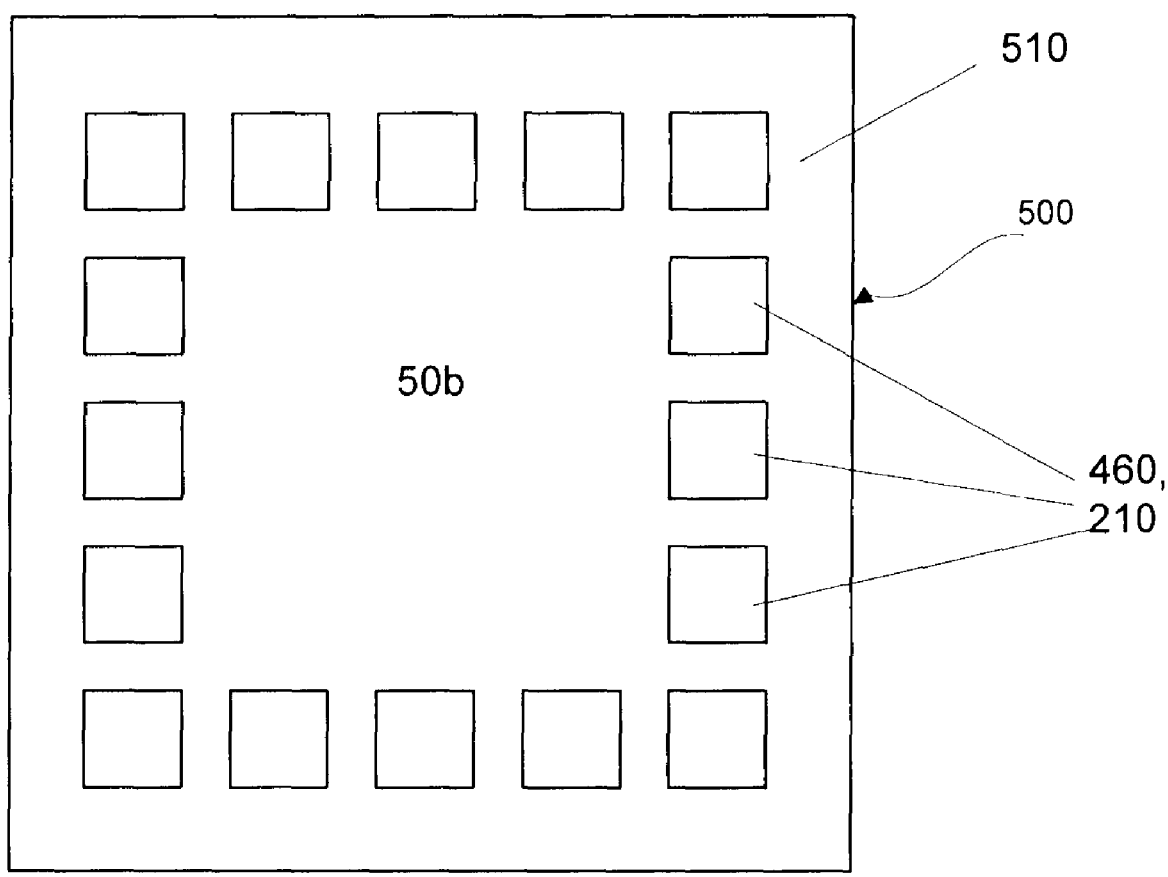

FIG. 6 illustrates the backside illuminated image sensor chip 50b on a wafer 500, according to the embodiments of FIG. 4 above. As shown in FIG. 6, chip 50b comprises a first bond pad set 210 and a second pad 460. However, unlike sensor chip 50a of FIG. 5, both pads 210, 460 are located inside the chip 50b, instead of the scribe line area 510, because pad 460 is positioned directly over the first bond pad set 210. By providing a probe or wire access to pad 460, testing measurements may be taken directly from the first set of pads 210 via contacts or vias 470 without penetrating through carrier wafer 140. Thus, wafer level testing may now be performed.

Figure 7:
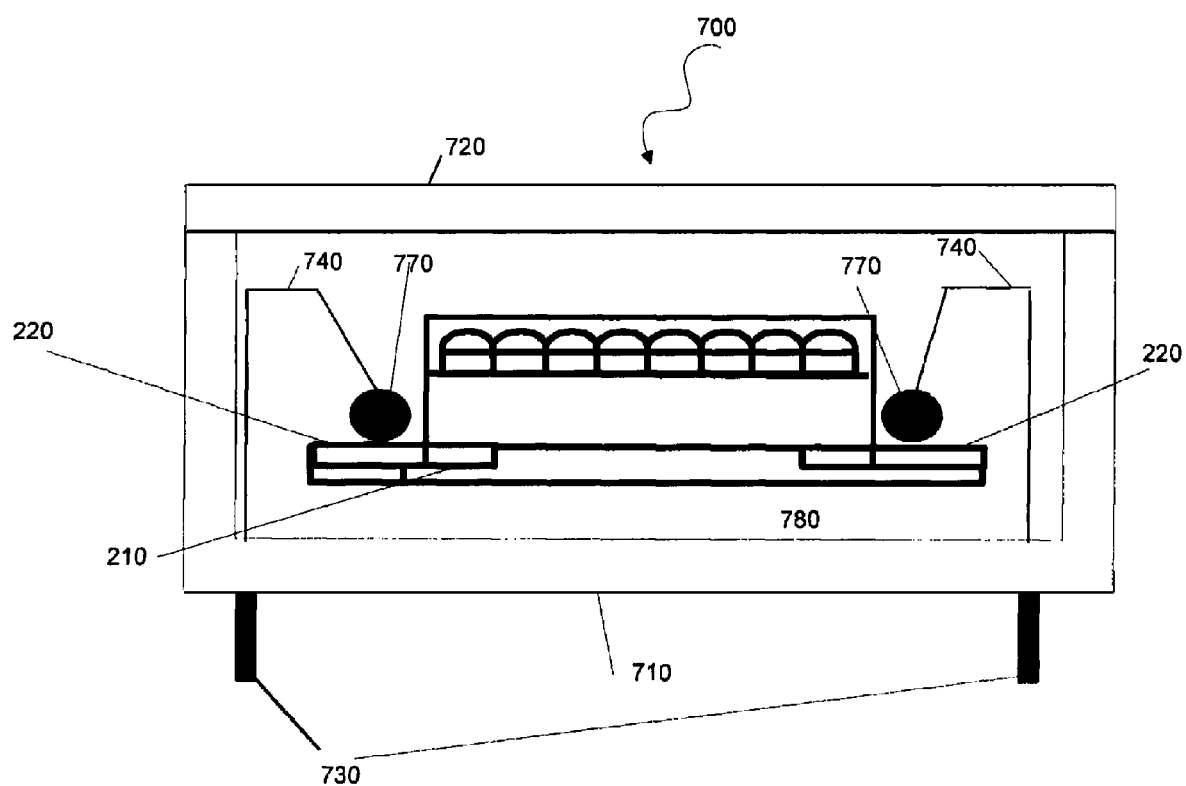
FIG. 7 is a side, cross-sectional view of a backside illuminated sensor after assembly.

Referring to FIG. 7, the sensor chip 50 may be removed from the wafer and placed into a package 700. Package 700 includes a holder 710, a transparent member 720, such as glass, and a set of pins, bumps, balls, or other external connections 730. The connections 730 can be electrically coupled to the extended bond pads described above. In the present example, bond wires 740 connect to the second bond pad set 220 of chip 50a (FIG. 3) through bumps 770. This could also be done with the second pad 460 of chip 50b (FIG. 4).

Thus, a novel backside illuminated sensor is provided. In one embodiment, the sensor includes a substrate, a first bond pad, a second bond pad, and an electrical connection between the two pads. The first bond pad is positioned above a front side of the substrate and the second bond pad is positioned to be accessible from a backside of the substrate.

In some embodiments, the first bond pad is located within a periphery of the backside illuminated sensor, and the second bond pad is located in a scribe area adjacent to the backside illuminated sensor.

In some embodiments, the second bond pad is positioned on the back side of the substrate.

A novel method of providing metal extension in a backside illuminated sensor is also provided. In one embodiment, the method includes providing a substrate and providing a first set of pads and a second set of pads on a front side of the substrate. The method further includes providing a metal extension through a metal layer for electrically coupling the first set of pads to the second set of pads and exposing a pad in the second set of pads to a back side of the substrate for testing.

In another embodiment, a method of providing metal extension in a backside illuminated sensor includes providing a first set of pads in a backside illuminated sensor on a front side of a substrate and providing at least one second pad positioned directly below the first set of pads, with reference to the substrate. The method further includes electrically coupling the at least one second pad to the first set of pads and exposing the at least one second pad to the back side of the substrate.

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. An apparatus comprising a back side illuminated image sensor that includes:

a substrate having a front side and a back side that is opposite to the front side;

an image-sensing pixel formed within the substrate, the pixel being operable to sense radiation that enters the substrate from the back side;

a first bond pad positioned above the front side of the substrate;

a second bond pad positioned to be accessible from the back side of the substrate; and an electrical connection for connecting the first and second bond pads to form a metal extension bond pad.

2. The apparatus of claim 1 wherein the first bond pad is located within a periphery of the back side illuminated image sensor, and the second bond pad is located in a scribe line area adjacent to the back side illuminated sensor.

3. The apparatus of claim 2 wherein the first bond pad is part of a first bond pad set comprising pads in a plurality of metal layers, and wherein the electrical connection is provided by a metal line in at least one of the plurality of metal layers extending to the second bond pad.

4. The apparatus of claim 1 wherein the second bond pad is positioned on the back side of the substrate.

5. The apparatus of claim 4 wherein the second bond pad is substantially vertically aligned with the first bond pad.

6. The apparatus of claim 4 wherein the electrical connection is one or more vias.

7. The apparatus of claim 4, further comprises an opening formed through the substrate for probing from a back side of the second bond pad.

8. The apparatus of claim 7 wherein width of the opening is from about 30 um to about 200 um.

9. The apparatus of claim 7, further comprises a metal barrier layer overlying the back side of the second bond pad.

10. The image sensor of claim 1, wherein the first and second bond pads are both positioned above the front side of the substrate.

11. The apparatus of claim 1, wherein the image sensor further includes:

an interconnect structure that is located over the front side of the substrate; and a lens that is located over the back side of the substrate.

12. An apparatus comprising:

a backside illuminated sensor having a frontside and a backside, the frontside including a pixel, the backside including a first portion for receiving an image to be sensed by the pixel and a second portion having a plurality of exposed extended bond pads;

a package including a cavity and a plurality of external connectors, the cavity having a holder portion for engaging and securing the backside illuminated image sensor; and a plurality of electrical conductors connected between the plurality of exposed extended bond pads and the plurality of external connectors.

13. An image sensor comprising:

a substrate having a first surface, a second surface opposed to the first surface, and an opening between the first and second surfaces;

a first bond pad positioned over the first surface of the substrate;

a second bond pad positioned to be vertically aligned with the opening in the substrate;

an electrical connection for connecting the first and second bond pads; and a pixel formed in the substrate, the pixel being adjacent to the first surface and being operable to detect radiation projected toward the pixel through the second surface.

14. The image sensor of claim 13, further including a plurality of light-sensing pixels formed on the first surface.

15. The image sensor of claim 14, further including color-filters and microlenses formed on the second surface.

16. The image sensor of claim 13 wherein the first bond pad is located within a periphery of the image sensor, and the second bond pad is located in a scribe line area adjacent to the image sensor.

17. The image sensor of claim 16 wherein the first bond pad is part of a first bond pad set comprising pads in a plurality of metal layers, and wherein the electrical connection is provided by a metal line in at least one of the plurality of metal layers extending to the second bond pad.

18. The image sensor of claim 13 wherein the second bond pad is positioned on the second surface.

19. The image sensor of claim 18, wherein the second bond pad is substantially vertically aligned with the first bond pad.

20. The image sensor of claim 13, wherein the first and second bond pads are both located over the first surface.

* * * * *